(12) United States Patent
Nongaillard et al.

(10) Patent No.: US 12,243,937 B2
(45) Date of Patent: Mar. 4, 2025

(54) BIDIRECTIONAL DEVICE PROVIDED WITH A STACK OF TWO HIGH ELECTRON MOBILITY TRANSISTORS CONNECTED HEAD-TO-TAIL

(71) Applicants: STMicroelectronics France, Montrouge (FR); STMicroelectronics International N.V., Geneva (CH)

(72) Inventors: Matthieu Nongaillard, Grenoble (FR); Thomas Oheix, Grenoble (FR)

(73) Assignees: STMicroelectronics France, Montrouge (FR); STMicroelectronics International N.V., Geneva (CH)

( * ) Notice: Subject to any disclaimer, the term of this patent is extended or adjusted under 35 U.S.C. 154(b) by 390 days.

(21) Appl. No.: 17/711,597

(22) Filed: Apr. 1, 2022

(65) Prior Publication Data

US 2022/0336651 A1    Oct. 20, 2022

(30) Foreign Application Priority Data

Apr. 14, 2021   (FR) ...................................... 2103832

(51) Int. Cl.
*H01L 29/778* (2006.01)
*H01L 27/12* (2006.01)
(Continued)

(52) U.S. Cl.
CPC .......... *H01L 29/7786* (2013.01); *H01L 27/12* (2013.01); *H01L 29/2003* (2013.01); *H01L 29/205* (2013.01); *H01L 29/872* (2013.01)

(58) Field of Classification Search
CPC . H01L 29/7786; H01L 27/12; H01L 29/2003; H01L 29/205; H01L 29/872;
(Continued)

(56) References Cited

U.S. PATENT DOCUMENTS

2009/0167411 A1    7/2009  Machida et al.
2013/0234207 A1    9/2013  Choi et al.
(Continued)

FOREIGN PATENT DOCUMENTS

EP    2731132 A2    5/2014
EP    3293758 A1    3/2018

OTHER PUBLICATIONS

Yijun Shi et al: "A high-performance GaN E-mode reverse blocking MISHEMT with MIS field effect drain for bidirectional switch", Proceedings of the 29th International Symposium on Power Semiconductor Devices and ICs (ISPSD), IEEJ, May 28, 2017, pp. 207-210, XP033128681) (Year: 2017).*
(Continued)

*Primary Examiner* — Tong-Ho Kim
(74) *Attorney, Agent, or Firm* — Seed IP Law Group LLP

(57) ABSTRACT

The disclosure concerns a device which comprises a stack of two high electron mobility transistors, referred to as first and second transistor, separated by an insulating layer and each provided with a stack of semiconductor layers respectively referred to as first stack and second stack, the first and the second stack each comprising, from the insulating layer to, respectively, a first and a second surface, a barrier layer and a channel layer, the first and the second transistor respectively comprising a first set of electrodes and a second set of electrodes, the first and the second set of electrodes each comprising a source electrode, a drain electrode, and a gate electrode which are arranged so that the first and the second transistor are electrically connected head-to-tail.

20 Claims, 4 Drawing Sheets

(51) Int. Cl.
  *H01L 29/20* (2006.01)
  *H01L 29/205* (2006.01)
  *H01L 29/872* (2006.01)
(58) Field of Classification Search
  CPC ............... H01L 21/8252; H01L 27/082; H01L 27/0605; H01L 27/0629; H01L 27/0688; H01L 27/0727; H01L 29/4175; H01L 29/41766
  USPC .......................................................... 257/194
  See application file for complete search history.

(56) References Cited

U.S. PATENT DOCUMENTS

| | | | |
|---|---|---|---|
| 2014/0131887 A1* | 5/2014 | Lee | ..................... H01L 25/0657 257/774 |
| 2015/0048420 A1 | 2/2015 | Leomant et al. | |
| 2015/0069615 A1 | 3/2015 | Ohno et al. | |
| 2022/0320325 A1 | 10/2022 | Nongaillard et al. | |
| 2022/0359714 A1 | 11/2022 | Nongaillard et al. | |

OTHER PUBLICATIONS

Shi et al., "A High-Performance GaN E-mode Reverse Blocking MISHEMT with MIS Field Effect Drain for Bidirectional Switch," *Proceedings of The 29th International Symposium on Power Semiconductor Devices & ICs*, Sapporo, Japan, May 28, 2017, pp. 207-210.

Jones et al., "Application-Based Review of GaN HFETs," 2014 IEEE Workshop on Wide Bandgap Power Devices and Applications, Oct. 2014, pp. 24-29.

Wen et al., "A Dual-Mode Driver IC With Monolithic Negative Drive-Voltage Capability and Digital Current-Mode Controller for Depletion-Mode GaN Hemt," *IEEE Transactions on Power Electronics* 32(1):423-432, Jan. 2017.

\* cited by examiner

BIDIRECTIONAL DEVICE PROVIDED WITH A STACK OF TWO HIGH ELECTRON MOBILITY TRANSISTORS CONNECTED HEAD-TO-TAIL

CROSS-REFERENCE TO RELATED APPLICATION(S)

This application claims the priority benefit of French patent application number 2103832, filed on Apr. 14, 2021, entitled "BIDIRECTIONAL DEVICE PROVIDED WITH A STACK OF TWO HIGH ELECTRON MOBILITY TRANSISTORS CONNECTED HEAD-TO-TAIL," which is hereby incorporated by reference to the maximum extent allowable by law."

BACKGROUND

Technical Field

The disclosure relates to the field of electronics, and in some implementations of power electronics. In some implementations, the present invention concerns a device provided with two high electron mobility transistors.

Description of the Related Art

High electron mobility transistors ("HEMT"), well known by those skilled in the art, are now widely implemented in the field of hyperfrequencies and that of switches for power electronics converters.

In this regard, HEMT transistors are generally elaborated from layers of III-V semiconductor materials and in some implementations III-N semiconductor materials.

In some implementations.

BRIEF SUMMARY

The device according to the present disclosure is in some implementations arranged to allow a better integration of the two high electron mobility transistors.

The arrangement provided in the present disclosure enables in this respect to obtain a bidirectional and compact device.

The present disclosure provides a device which comprises a stack of two high electron mobility transistors, referred to as first and second transistor, separated by an insulating layer and each provided with a stack of semiconductor layers respectively referred to as first stack and second stack, the first and the second stack each comprise, from the insulating layer to, respectively, a first surface and a second surface, a barrier layer and a channel layer, the first and the second transistor respectively comprise a first set of electrodes and a second set of electrodes, the first and the second set of electrodes each comprise a source electrode, a drain electrode, and a gate electrode which are arranged so that the first and the second transistor are electrically connected head-to-tail.

The head-to-tail connection of the two HEMT transistors thus enables to form a compact and bidirectional device. The implementation of two HEMT transistors, rather than a single bidirectional HEMT transistor, also enables to limit resistivity Ron.

This device implies no major resizing of the HEMT transistors.

According to an implementation, said device comprises two terminals respectively referred to as first terminal and second terminal, the first terminal being in electric contact with one of the drain electrode of the first set and of the source electrode of the second set, and the second terminal being in electric contact with one of the drain electrode of the first set and of the source electrode of the second set.

According to an implementation, the first terminal comprises a first pad resting on one or the other of the first surface and of the second surface, and the second terminal comprises a second pad resting on one or the other of the first and of the second surface.

According to an implementation, the gate electrode of the first set and the gate electrode of the second set are arranged to control the switching, respectively, of the first transistor and of the second transistor from one of a conductive state and of a non-conductive state to the other of these two states.

According to an implementation, the channel layer of the first transistor, when the latter is in a conductive state, is capable of forming a conduction layer, referred to as first conduction layer, and where a current is likely to flow from the first terminal to the second terminal, and the channel layer of the second transistor, when the latter is in a conductive state, is capable of forming a conduction layer, referred to as second conduction layer, and where a current is likely to flow from the second terminal to the first terminal.

According to an implementation, the head-to-tail electric connection of the first and of the second transistor comprises a connection of the drain electrode of the first set to the source electrode of the second set and of the source electrode of the first set to the drain electrode of the second set.

According to an implementation, the connection between the drain electrode of the first set and the source electrode of the second set is direct so that each of these electrodes is at the same electric potential, and the connection between the source electrode of the first set and the drain electrode of the second set is direct so that each of these two electrodes is at the same electrode potential.

According to an implementation, the source electrode of the first set is one and the same as the drain electrode of the second set, and the drain electrode of the first set is one and the same as the source electrode of the second set.

According to an implementation, a diode, referred to as first diode, is interposed between the source electrode of the first set and the drain electrode of the second set, said first diode being arranged to allow the flowing of a current from the first terminal to the second terminal, and another diode, referred to as second diode, is interposed between the drain electrode of the first set and the source electrode of the second set, said second diode being arranged to allow the flowing of a current from the second terminal to the first terminal.

The implementation of the first and of the second diode thus makes it possible to use the device for high voltages, and in some implementations higher than 600 V.

According to an implementation, the first diode and the second diode are respectively formed in the first stack and in the second stack.

According to an implementation, the insulating layer comprises a dielectric material, in some implementations silicon dioxide or silicon nitride.

According to an implementation, said device comprises two pads, referred to as first gate pad and second gate pad, respectively arranged on the first surface and the second surface, the first gate pad electrically contacting the gate electrode of the first set, and the second gate pad electrically contacting the gate electrode of the second set.

According to an implementation, the first and the second stack are essentially identical.

According to an implementation, the first and the second transistor have an identical threshold voltage.

According to an implementation, the two channel layers comprise GaN and the barrier layers comprise an AlGaN ternary alloy.

BRIEF DESCRIPTION OF THE SEVERAL VIEWS OF THE DRAWINGS

Other features and advantages of the disclosure will appear from the following detailed description in relation with the appended drawings, in which.

DETAILED DESCRIPTION

Figure 1:
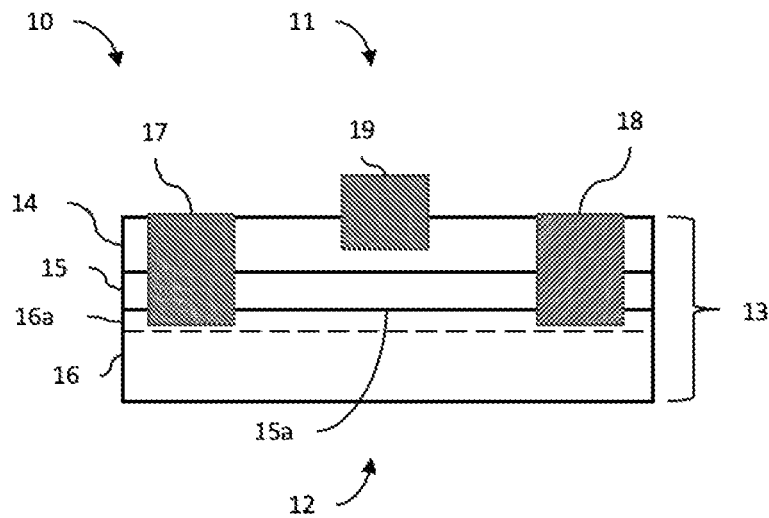
FIG. 1 is a simplified representation of a HEMT transistor shown along a cross-section plane perpendicular to the front side.

FIG. 1 shows a HEMT transistor 10. This HEMT transistor 10 is provided with a stack 13 which comprises, from a front side 11 to a back side 12, an insulator layer 14, a barrier layer 15, and a channel layer 16 capable of forming a conduction layer 16a in the form of a two-dimensional electron gas layer. In some implementations, conduction layer 16a extends in channel layer 16 from an interface 15a, formed between barrier layer 15 and said channel layer 16.

The III-V semiconductor materials selected to form barrier layer 15 and/or channel layer 16 may comprise gallium nitride (GaN), aluminum nitride (AlN), $Al_xGa_{1-x}N_x$ ternary alloys, gallium arsenide (GaAs), AlGaAs or InGaAs ternary alloys. For example, barrier layer 15 and channel layer 16 may respectively comprise an AlGaN compound and GaN. Insulator layer 14 may comprise a dielectric material, and in some implementations silicon dioxide ($SiO_2$) or silicon nitride ($Si_3N_4$).

HEMT transistor 10 also comprises a source electrode 17 and a drain electrode 18 in electric contact with conduction layer 16a. In some implementations, source electrode 17 and drain electrode 18 emerge through front side 11, and cross barrier layer 15 to reach interface 15a and electrically contact conduction layer 16a. Source electrode 17 and drain electrode 18 may partially or integrally cross conduction layer 16a. Source electrode 17 and drain electrode 18 may comprise a metal species, for example, aluminum, filling trenches formed in stack 13.

HEMT transistor 10 also comprises a gate electrode 19 intended to be imposed a voltage Vg enabling to control the state of conduction layer 16a. In some implementations, when the electric potential difference between gate electrode 19 and source electrode 17, noted Vg-Vs, is greater than a threshold voltage Vth characteristic of HEMT transistor 10, said transistor is in the conductive state. Conversely, when Vg-Vs is smaller than Vth, HEMT transistor 10 is in the non-conductive state, and thus behaves as an off switch.

Thus, depending on the value of threshold voltage Vth, and in some implementations on its sign, a HEMT transistor may be in depletion (normally-on) mode if its threshold voltage Vth is negative, or in enhancement (normally-off) mode if its threshold voltage Vth is positive.

Such a high electron mobility transistor however has an on-state resistivity Ron (Ron being the on-state drain/source resistance) which limits the intensity of the current likely to flow through the conduction layer.

In this regard, the main parameters influencing resistivity Ron are:
- the surface resistance of the channel layer;
- the resistance of the contacts between the conduction layer and the source and drain electrodes;
- the electric resistivities of the routing metals of the chips;
- the electric resistances induced in the final assembly having the high electron mobility transistor integrated therein.

There further exist situations, in some implementations in the field of power conversion and/or storage, for which a bidirectionality of the HEMT transistors may be required. However, such bidirectional transistors, unless occupying a relatively large surface area, have too high an on-state resistivity Ron.

An aim of the present disclosure thus is to provide a more compact bidirectional electronic device provided with high electron mobility transistors and having a reasonable on-state resistivity as compared with known devices of the state of the art.

Another aim of the present disclosure is to provide a bidirectional electronic device likely to operate at high electric voltages, in some implementations higher than 600 V.

It should be understood that the different drawings shown in relation with the present description are given as an illustration only and by no way limit the disclosure. It should be clear that the relative scales or dimensions may not be respected.

All throughout the description, it is admitted that a layer or an interface is generally planar and extends along a plane parallel to the (0, x, y) plane of the (0, x, y, z) orthonormal reference frame. Further, when reference is made to a representation along a cross-section plane, the latter is perpendicular to all the planes formed by the layers, and in some implementations perpendicular to the (0, x, y) plane. It should also be understood that, when reference is made to a stack of layers, the latter are stacked along the z direction of the (0, x, y, z) orthonormal reference frame.

The disclosure concerns a device formed by two (or more) high electron mobility transistors, (hereafter, "HEMT transistors") respectively referred to as first transistor and second transistor stacked together. The HEMT transistors each comprise a stack of semiconductor layers respectively referred to as first stack and second stack. In some implementations, the first stack and the second stack are separated by an insulating layer and each extends from said insulating layer to, respectively, a first surface and a second surface of the device. In some implementations, each stack comprises, from the insulating layer, a barrier layer and a channel layer.

The first stack and the second stack also each comprise a set of electrodes respectively referred to as first set and second set. Each set of electrodes is in some implementations provided with a source electrode, a drain electrode, and a gate electrode which are arranged so that the first transistor and the second transistor are connected head-to-tail.

The device may also comprise two terminals respectively referred to as first terminal and second terminal (the latter form connection points) and between which a current is likely to flow either in the first transistor or in the second transistor.

In some implementations, the two terminals are respectively connected to a drain electrode of one of the first or the second HEMT transistor, and connected to a source electrode of another one of the first or the second HEMT transistor. For example, the first terminal may be in electric contact with one of the drain electrode of the first set or of the source electrode of the second set, while the second terminal may be in electric contact with one of the drain electrode of the second set or of the source electrode of the first set.

Such an arrangement forms a device which is both compact and bidirectional.

"Connected head-to-tail" is used to refer to two HEMT transistors connected according to opposite biasings. In some implementations, according to the terms of the present disclosure, two HEMT transistors are assembled head-to-tail when the source electrode of one of the transistors is electrically connected to the drain electrode of the other one of the transistors. In other words, the source electrode of the first transistor is connected to the drain electrode of the second transistor while the drain electrode of the first transistor is connected to the source electrode of the second transistor.

"Bidirectional device" is used to refer to a device arranged to conduct the current between two of its terminals in two opposite directions. In some implementations, according to the terms of the present disclosure, the first transistor, when it is in a conductive state, enables the flowing of a current in its channel layer from the first terminal to the second terminal (in a first direction). Equivalently, the second transistor, when it is in a conductive state, enables the flowing of a current in its channel layer from the second terminal to the first terminal (in a second direction opposite to the first direction).

Further, for a given HEMT transistor, the switching from one or the other of the conductive state and of the non-conductive state to the other one of these two states is controlled by the gate electrode of the concerned transistor. In some implementations, this control is executed by imposing a voltage Vg to the gate electrode. In some implementations, when the potential difference Vg-Vs between the gate electrode and the source electrode of the HEMT transistor is greater than its threshold voltage Vth, said transistor is in the conductive state and behaves as a conductive wire. On the contrary, when the potential difference Vg-Vs is smaller than the threshold voltage, the HEMT transistor is in a non-conductive state and behaves as an off switch.

Figure 2:
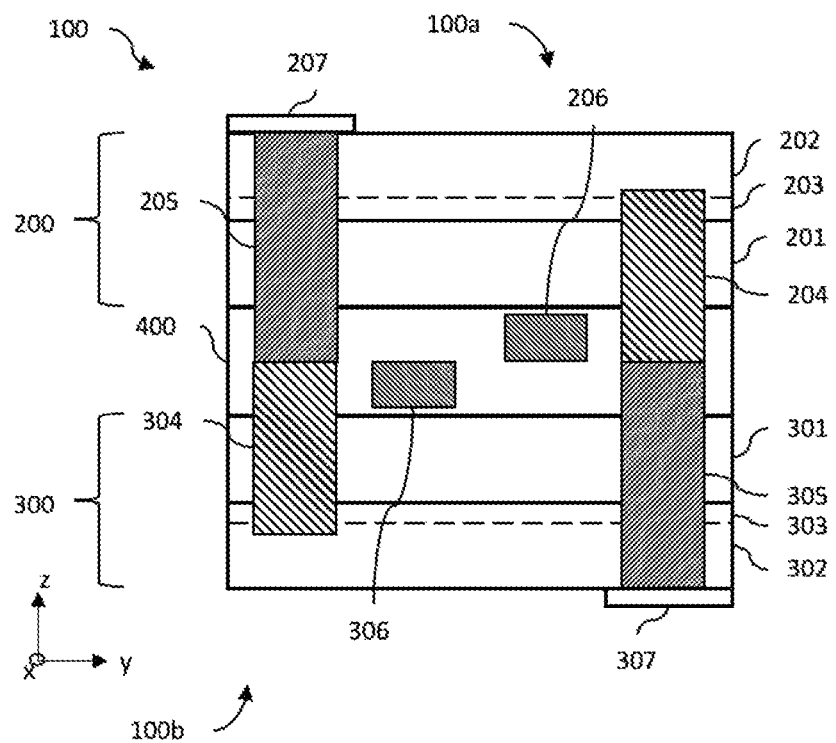
FIG. 2 is a simplified representation of a device, along a cross-section plane running through the active area of said device, according to a first embodiment of the present disclosure.

FIG. 2 is a simplified representation of a device 100 according to an embodiment of the present disclosure.

The following description (relative to the first embodiment) will be limited to a first terminal in electric contact with the drain electrode of the first set and to a second terminal in electric contact with the drain electrode of the second set. Those skilled in the art, based on their general knowledge and on the present disclosure, may generalize the described concepts and thus consider other relative arrangements relative to the first terminal and to the second terminal.

Device 100 in some implementations comprises two high electron mobility transistors (HEMT) respectively referred to as first transistor 200 and second transistor 300. In some implementations, device 100 comprises, from a first surface 100a to a second surface 100b, first transistor 200, an insulating layer 400, and second transistor 300.

Insulating layer 400 may comprise a dielectric material, in some implementations, silicon dioxide or silicon nitride.

First transistor 200 and second transistor 300 each comprise a stack of semiconductor layers respectively referred to as first stack and second stack.

Each stack of semiconductor layers may in some implementations comprise group-III-V semiconductor materials, and in some implementations group-III-N semiconductor materials. The group-III-V semiconductor materials may in some implementations be selected from among gallium nitride (GaN), aluminum nitride (AlN), and their $Al_xGa_{1-x}N$ ternary alloys, or from among gallium arsenide (GaAs) and its compounds (AlGaAs, InGaAs).

Each stack of semiconductor layers comprises, from the insulating layer, a barrier layer and a channel layer.

In some implementations, the first stack comprises, from insulating layer 400 to first surface 100a, a first barrier layer 201 and a first channel layer 202.

The second stack comprises, from insulating layer 400 to second surface 100b, a second barrier layer 301 and a second channel layer 302.

As an example and according to the present disclosure, a barrier layer may comprise an $Al_xGa_{1-x}N$ ternary alloy while a channel layer may comprise GaN.

Further, a barrier layer may have a thickness in the range from 1 nm to 100 nm.

A channel layer may have a thickness in the range from 10 nm to 2 µm.

The first and the second stack may mirror one another, e.g., may be essentially identical in material and structural configurations.

A stack of semiconductor layers, according to the terms of the present disclosure, is capable of forming a two-dimensional electron gas (2DEG) which forms a conduction layer or region.

The conduction layer, within a stack, extends in the channel layer, from the interface formed between the barrier layer and the channel layer of the considered stack. The conduction layer is in some implementations likely to be formed within a HEMT transistor when the latter is in a conductive state.

Thus, when first transistor 200 is in the conductive state, first channel layer 202 is capable of forming a first conduction layer 203, which extends in said first channel layer 202, from a first interface formed between first barrier layer 201 and first channel layer 202.

When second transistor 300 is in the conductive state, second channel layer 302 is capable of forming a second conduction layer 303, which extends in said second channel layer 302, from a second interface formed between second barrier layer 301 and second channel layer 302.

Each HEMT transistor comprises a set of electrodes including a source electrode, a drain electrode, and a gate electrode.

In some implementations, first transistor 200 comprises one of the two sets of electrodes referred to as first set. The first set includes a first source electrode 204, with a first drain electrode 205, and with a first gate electrode 206.

The second transistor 300 comprises the other one of the two sets of electrodes, referred to as second set. The second set includes a second source electrode 304, with a second drain electrode 305, and with a second gate electrode 306.

First source electrode 204 and first drain electrode 205 extend from insulating layer 400 to the first stack. In some implementations, first drain electrode 205 and first source electrode 204 partly cross the first stack and partly cross first channel layer 202. Thus, one and the other of the first drain electrode 205 and of the first source electrode 204 electrically contact first channel layer 202 and contact in some implementations first conduction layer 203 in the first channel layer 202.

In some implementations, first drain electrode 205 emerges at the level of first surface 100a. In this respect, the device may comprise a pad, referred to as first drain pad 207, resting on the first surface and in contact with the first drain electrode. This first drain pad 207 forms a first terminal of device 100. The first drain pad in some implementations comprises a doped semiconductor material, for example, doped silicon.

Second source electrode 304 and second drain electrode 305 extend from insulating layer 400 to the second stack. In some implementations, second drain electrode 305 and second source electrode 304 partly cross the second stack and in some implementations partly cross the second channel layer 302. Thus, one and the other of second drain electrode 305 and of second source electrode 304 electrically contact second channel layer 302 and in some implementations contacts second conduction layer 303.

In some implementations, second drain electrode 305 emerges at the level of second surface 100a. In this respect, the device may comprise another pad, referred to as second drain pad 307, resting on the second surface and in contact with the second drain electrode. This second drain pad 307 forms a second terminal of the device. The second drain pad in some implementations comprises a doped semiconductor material, for example, doped silicon.

According to the present disclosure, first transistor 200 and second transistor 300 are connected head-to-tail. In some implementations, first drain electrode 205 electrically contacts second source electrode 304, while first source electrode 204 electrically contacts second drain electrode 305.

According to an embodiment of the present disclosure, the electric contact between a source electrode and a drain electrode is direct. "Direct contact" is used to refer to that two electrodes are at the same electric potential. In some implementations, the source electrode of the first set is one and the same as the drain electrode of the second set, and the drain electrode of the first set is one and the same as the source electrode of the second set.

First gate electrode 206 and second gate electrode 306 each extend along a direction perpendicular to the first surface and in insulating layer 400. In some implementations, first gate electrode 206 on the one hand and second gate electrode 306 on the other hand remain distant at the level of an active area ZA (FIG. 3 and FIG. 4) of the device, respectively, of the first stack and of the second stack.

First gate electrode 206 and second gate electrode 306 enable to control the conductive or non-conductive state, respectively, of the first transistor and of the second transistor.

In some implementations, this control is executed by imposing an electric potential Vg to the gate electrode, and in some implementations an electric potential difference DDP, noted Vg-Vs between the gate electrode and the source electrode of the considered HEMT transistor.

Thus, when Vg-Vs is greater than a threshold voltage Vth characteristic of each of the HEMT transistors, the latter is in the conductive state. Conversely, when Vg-Vs is smaller than Vth, the HEMT transistor is in the non-conductive state, and thus behaves as an off switch.

Thus, depending on the value of threshold voltage Vth, and in some implementations on its sign, an HEMT transistor may be in depletion (normally-on) mode if its threshold voltage Vth is negative, or in enhancement (normally-off) mode if its threshold voltage Vth is positive.

Thus, the HEMT transistors likely to be considered in the present disclosure may be either of normally-on or depletion type (depletion mode high electron mobility transistor) or of normally-off or enhancement type (enhancement mode high electron mobility transistor).

Figure 3:
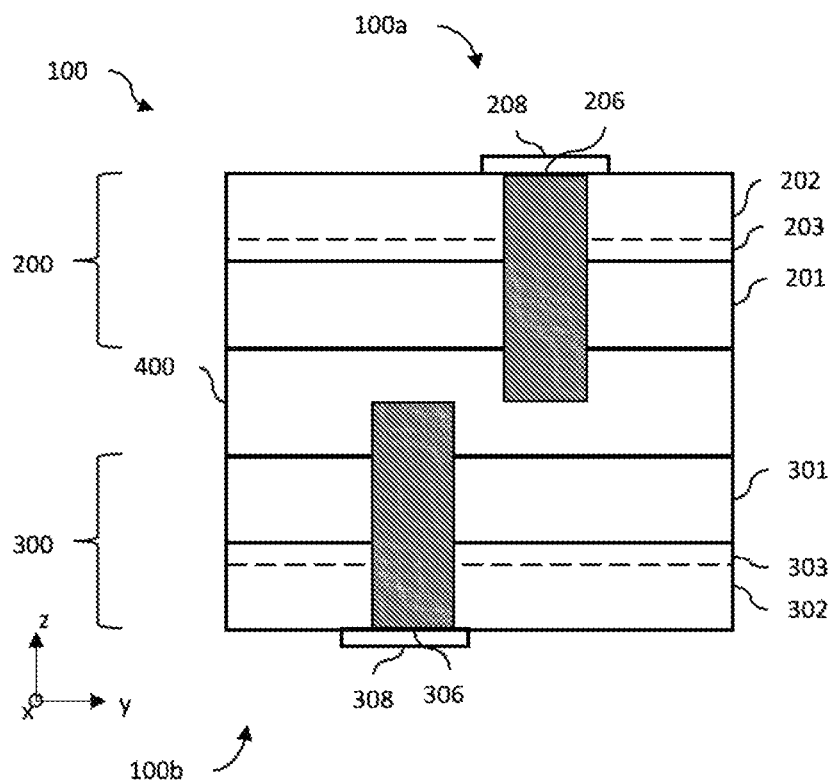
FIG. 3 is a simplified representation of a device, along a cross-section plane outside of the active area, according to the first embodiment of the present disclosure.

Device 100 also comprises a first gate pad 208 and a second gate pad 308 arranged, respectively, on first surface 100a and on second surface 100b. First gate pad 208 is configured to electrically contact first gate electrode 206. The electric contact is however offset from active area ZA (such as shown in FIG. 3 and in FIG. 4). Second gate pad 308 is configured to electrically contact second gate electrode 306. The electric contact is also offset from active area ZA.

Figure 4:
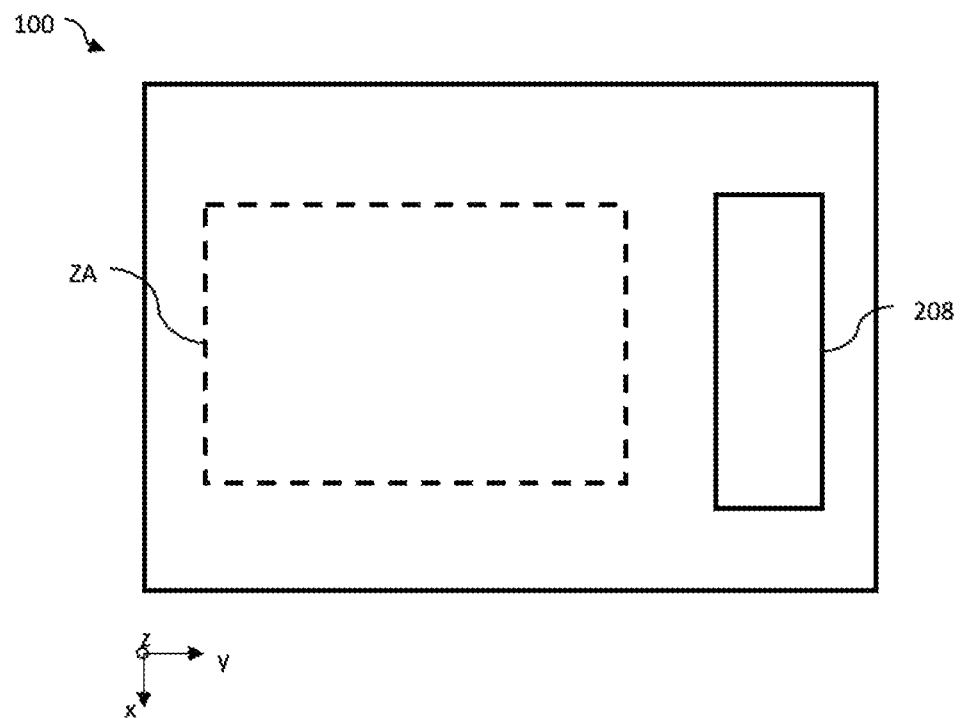
FIG. 4 is a representation illustrating the offset positioning of the first gate pad enabling to electrically connect the gate electrode of the device of FIG. 3 according to a view from the first surface of said device.

"Offset" is used to designate a gate pad, which is arranged outside of an active area ZA of one and the other of the first and of the second transistor. In this respect, FIG. 4 is a representation of device 100 according to a view from the first surface (along a plan parallel to the (0, x, y) plane). The dotted lines delimit active area ZA within which any contact between a gate electrode and one and the other of the barrier and channel layers is avoided.

Thus, it is possible to independently control the state of one and the other of the two HEMT transistors.

In some implementations, the control of first transistor 200 may be executed by applying a gate potential to first gate pad 208 to impose a conductive state or a non-conductive state to said first transistor 200.

The control of second transistor 300 may be executed by applying a gate potential to second gate pad 308 to impose a conductive state or a non-conductive state to said second transistor 300.

Figure 5:
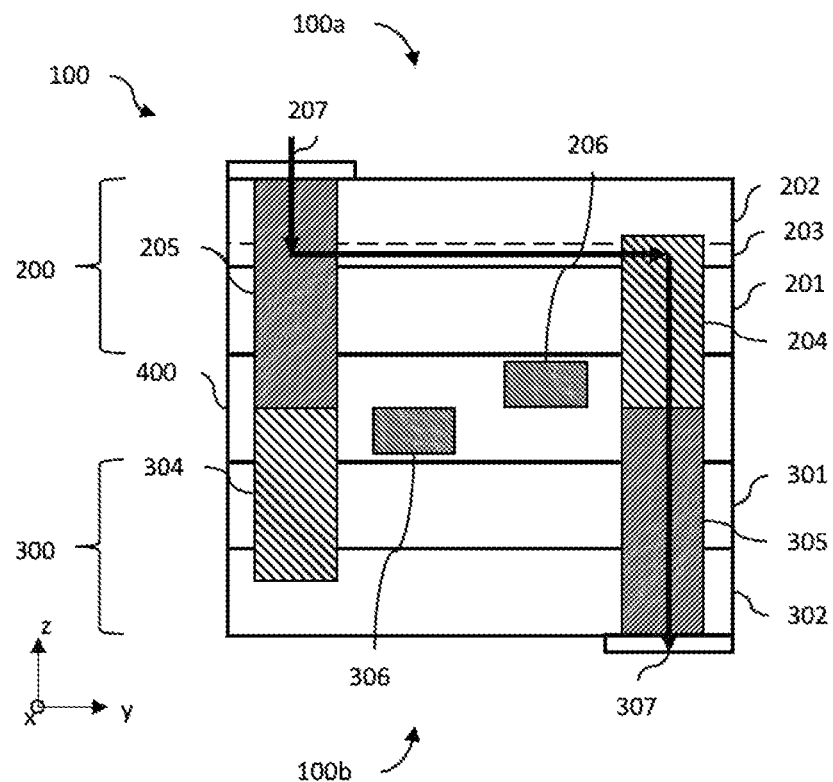
FIG. 5 is a simplified representation of the device of FIG. 2 when the first transistor is in the conductive state and the second transistor in the non-conductive state, the arrowed line representing the flowing of the current in the first direction.

Thus, when the first transistor is in the conductive state and the second transistor is in the non-conductive state, only the first transistor is likely to conduct a current. This current in some implementations flows, in a first direction (symbolized by the arrowed line in FIG. 5), from first drain electrode 205 to second drain electrode 305 via first conduction layer 203.

Figure 6:
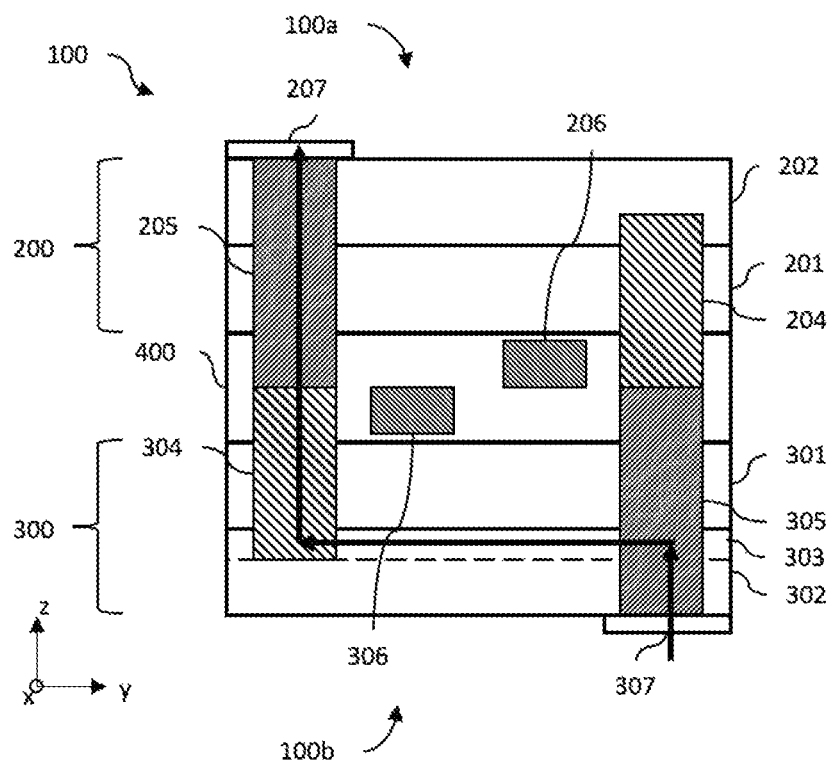
FIG. 6 is a simplified representation of the device of FIG. 2 when the first transistor is in the non-conductive state and the second transistor in the conductive state, the arrowed line representing the flowing of the current in the second direction.

When the second transistor is in the conductive state and the first transistor is in the non-conductive state, only the second transistor is likely to conduct a current. This current in some implementations flows, in a second direction opposite to the first direction (symbolized by the arrowed line in FIG. 6), from second drain electrode 305 to first drain electrode 205 via second conduction layer 303.

The device 100 according to this embodiment due to the considered stacks and to the arrangement of the first and second sets remains relatively compact. Further, the head-to-tail connection of the first transistor to the second transistor enables to form a bidirectional device.

According to an embodiment, the first drain electrode and the second drain electrode form the terminals of device 100. However, and according to another embodiment, it could have been considered to form these terminals with the first source electrode and the second source electrode, which would respectively emerge onto the first surface and the second surface.

Still in the context of this embodiment, instead of forming drain pads, it could have been considered to form source pads, and in some implementations a first source pad on the first surface and a second source pad on the second surface.

According to this configuration, the first source pad and the second source pad would be in contact, respectively, with the first source electrode and the second source electrode.

According to an embodiment, it could have been considered to form a first terminal with the source electrode of one of the two HEMT transistors and a second terminal with the source electrode of the other one of the two HEMT transistors.

The disclosure also concerns an embodiment which mostly uses all the terms of the other embodiments described herein.

Figure 7:
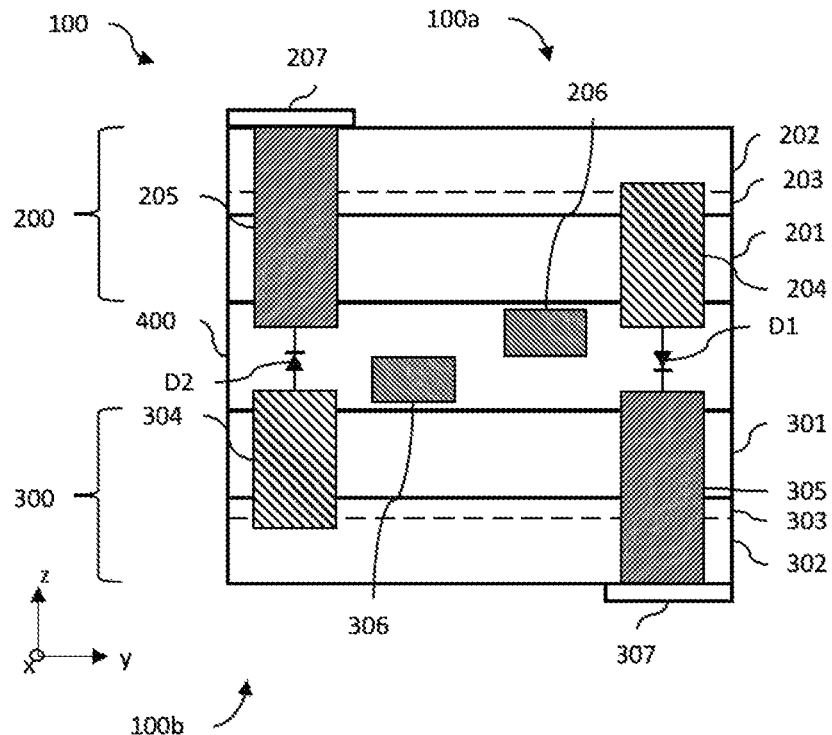
FIG. 7 is a simplified representation of a device, along a cross-section plane running through the active area of said device, according to a second embodiment of the present disclosure.

According to the embodiment illustrated in FIG. 7, the device comprises two diodes respectively referred to as first diode D1 and second diode D2.

First diode D1 is interposed between the source electrode 204 of the first set and the drain electrode 305 of the second set, while the second diode is interposed between the drain electrode of the first set and the source electrode of the second set.

Further, first diode D1 is arranged (or biased) to allow the flowing of a current in the first transistor from the first terminal to the second terminal. Equivalently, second diode D2 is arranged (or biased) to allow the flowing of a current in the second transistor from the second terminal to the first terminal.

The implementation of the first and of the second diode in some implementations enables to protect one and the other of the two source electrodes when the device is implemented for high-voltage applications, and in some implementations exceeding 600 V.

Diodes D1 and D2 in some implementations enable to prevent the biasing of one and the other of the two source electrodes when the device is submitted to a high voltage.

Diodes D1 and D2 in some implementations each comprise a Schottky diode.

Figure 8:
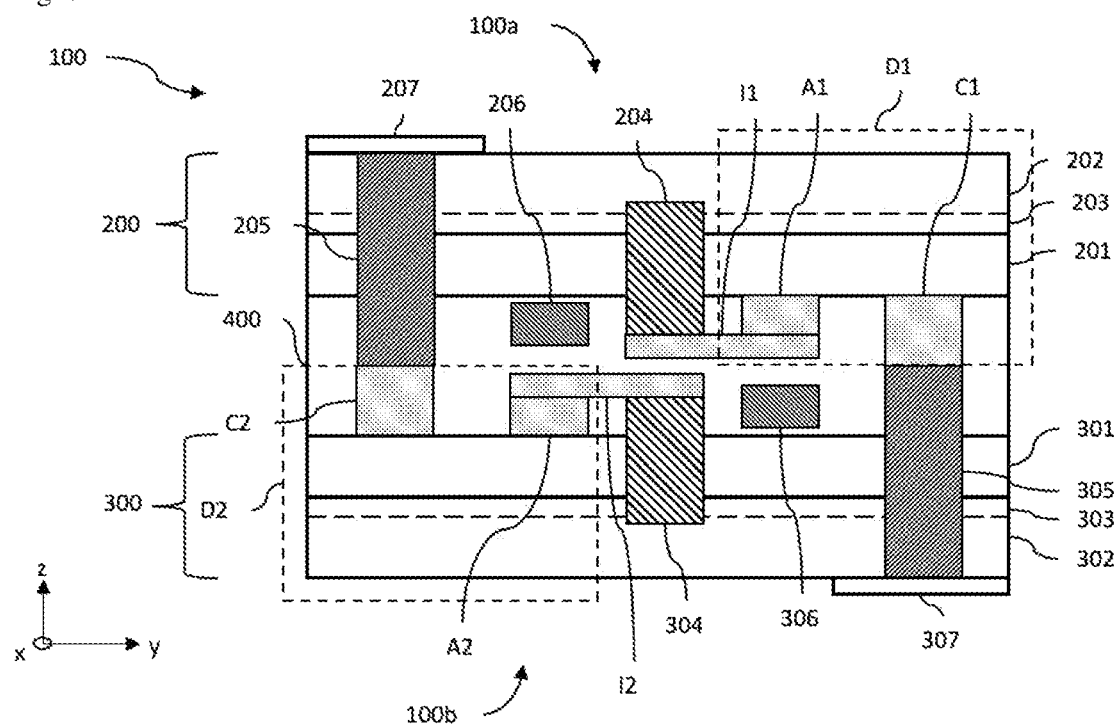
FIG. 8 is a simplified representation of a device, along a cross-section plane running through the active area of said device, according to the second embodiment of the present disclosure and for which the first and the second diode are formed in, respectively, the first stack and the second stack.

As shown in FIG. 8, the anode, referred to as first anode A1, and the cathode, referred to as first cathode C1, of first diode D1, are connected, respectively, to the source electrode of the first set and to the drain electrode of the second set.

The anode, referred to as second anode A2, and the cathode, referred to as second cathode C2, of second diode D2, are respectively connected to the source electrode of the second set and to the drain electrode of the first set.

In some implementations, first diode D1 and second diode D2 are respectively formed in the first stack and the second stack (FIG. 8).

In some implementations, the cathode C2 of the second diode extends in insulating layer 400 and in the second stack. Further, cathode C2 electrically contacts the first drain electrode in the insulating layer. Cathode C2 and the first drain electrode are in some implementations one and the same.

The cathode C1 of the first diode extends in insulating layer 400 and in the first stack. Further, cathode C1 electrically contacts the second drain electrode in the insulating layer. Cathode C1 and the second drain electrode are in some implementations one and the same.

The anode A1 of the first diode, arranged in the vicinity of cathode C1, extends in the insulating layer and in the first stack. A first interconnection I1, arranged in the insulating layer, enables to connect anode A1 to the first source electrode.

The anode A2 of the second diode, arranged in the vicinity of cathode C2, extends in the insulating layer and in the second stack. A second interconnection I2, arranged in the insulating layer, enables to connect anode A2 to the second source electrode.

This architecture enables to obtain a compact device 100 and capable of "withstanding" high voltages and in some implementations greater than 600 Volts.

The device 100 according to the present disclosure may in some implementations be implemented in voltage converters, and in some implementations high-voltage converters.

Of course, the disclosure is not limited to the described embodiments and alternative embodiments may be brought thereto without departing from the framework of the disclosure such as defined by the claims.

Device (100) may be summarized as including a stack of two high electron mobility transistors, referred to as first (200) and second (300) transistor, separated by an insulating layer (400) and each provided with a stack of semiconductor layers respectively referred to as first stack and second stack, the first and the second stack each including, from the insulating layer (400) to, respectively, a first (100a) and a second surface (100b), a barrier layer (201, 301) and a channel layer (202, 302), the first (200) and the second (300) transistor respectively including a first set of electrodes and a second set of electrodes, the first and the second set of electrodes each including a source electrode (204, 304), a drain electrode (205, 305), and a gate electrode (206, 306) which are arranged so that the first (200) and the second (300) transistor are electrically connected head-to-tail.

Said device (100) may include two terminals respectively referred to as first terminal and second terminal, the first terminal being in electric contact with one of the drain electrode (205) of the first set and of the source electrode (304) of the second set, and the second terminal being in electric contact with one of the drain electrode (305) of the second set and of the source electrode (204) of the first set.

The first terminal may include a first pad resting on one or the other of the first surface (100a) and of the second surface (100b), and the second terminal may include a second pad resting on one or the other of the first and of the second surface.

The gate electrode (206) of the first set and the gate electrode (306) of the second set may be arranged to control the switching, respectively of the first transistor (200) and of the second transistor (300), from one of a conductive state and of a non-conductive state to the other one of these two states.

The channel layer (202) of the first transistor (200), when the latter is in a conductive state, may be capable of forming a conduction layer, referred to as first conduction layer (203), and wherein a current is likely to flow from the first terminal to the second terminal, and the channel layer (302) of the second transistor, when the latter is in a conductive state, may be capable of forming a conduction layer, referred to as second conduction layer (303), and where a current is likely to flow from the second terminal to the first terminal.

The head-to-tail electric connection of the first and of the second transistor may include a connection of the drain electrode (205) of the first set to the source electrode (304) of the second set and of the source electrode (204) of the first set to the drain electrode (305) of the second set.

The connection between the drain electrode (205) of the first set and the source electrode (304) of the second set may be direct so that each of these two electrodes is at the same electric potential, and the connection between the source electrode (204) of the first set and the drain electrode (305) of the second set may be direct so that each of these two electrodes is at the same electric potential.

The source electrode (204) of the first set may be one and the same as the drain electrode (305) of the second set, and the drain electrode (205) of the first set may be one and the same as the source electrode (304) of the second set.

A diode, referred to as first diode (D1), may be interposed between the source electrode (204) of the first set and the drain electrode (305) of the second set, said first diode (D1) being arranged to allow the flowing of a current from the first terminal to the second terminal, and another diode, referred to as second diode (D2), may be interposed between the drain electrode (205) of the first set and the source electrode (304) of the second set, said second diode (D2) being arranged to allow the flowing of a current from the second terminal to the first terminal.

The first diode (D1) and the second diode (D2) may be formed, respectively, in the first stack and the second stack.

The insulating layer (400) may include a dielectric material, in some implementations silicon dioxide or silicon nitride.

Said device (100) may include two pads, referred to as first gate pad (208) and second gate pad (308), respectively arranged on the first surface (100a) and the second surface (100b), the first gate pad (208) electrically contacting the gate electrode (206) of the first set and the second gate pad (308) electrically contacting the gate electrode (306) of the second set.

The first and the second stack may be essentially identical.

The first (200) and the second (300) transistor may have an identical threshold voltage.

The two channel layers (202, 302) may include GaN and the barrier layers may include an AlGaN ternary alloy.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first high electron mobility (HEMT) transistor, the first HEMT transistor including a first stack of semiconductor layers on a first surface of an insulating layer, the first stack of semiconductor layers including, from the first surface of the insulating layer, a first barrier layer and a first channel layer, and the first HEMT transistor including a first source electrode, a first drain electrode, and a first gate electrode; and
a second HEMT transistor, the second HEMT transistor including a second stack of semiconductor layers on a second surface of the insulating layer that is opposite to the first surface, the second stack of semiconductor layers including, from the second surface of the insulating layer, a second barrier layer and a second channel layer, and the second HEMT transistor including a second source electrode, a second drain electrode, and a second gate electrode, the second source electrode coupled to the first drain electrode, and the second drain electrode coupled to the first source electrode,
wherein the first source electrode and the second drain electrode is a same conductive structure.

2. The device according to claim 1, further comprising a first terminal and a second terminal, the first terminal being in contact with one of the first drain electrode or the second source electrode, and the second terminal being in contact with one of the second drain electrode or the first source electrode.

3. The device according to claim 2, wherein the first terminal comprises a first pad on the first channel layer, and the second terminal comprises a second pad on the second channel layer.

4. The device according to claim 2, wherein the first channel layer is capable of forming a first conduction layer, through which a current flows from the first terminal to the second terminal.

5. The device according to claim 2, wherein the second channel layer is capable of forming a second conduction layer, through which a current flows from the second terminal to the first terminal.

6. The device according to claim 1, wherein the first gate electrode and the second gate electrode are configured to respectively control switching of the first HEMT transistor and of the second HEMT transistor between a conductive state and a non-conductive state.

7. The device according to claim 1, wherein the first drain electrode is directly coupled to the second source electrode, and the first source electrode is directly coupled to the second drain electrode.

8. The device according to claim 1, wherein the first drain electrode and the second source electrode is a same conductive structure.

9. The device according to claim 1, further comprising a first diode coupled between the first source electrode and the second drain electrode, and a second diode coupled between the first drain electrode and the second source electrode.

10. The device according to claim 9, wherein the first diode and the second diode are positioned, respectively, in the first stack of semiconductor layers and in the second stack of semiconductor layers.

11. The device according to claim 1, wherein the insulating layer comprises one or more of silicon dioxide or silicon nitride.

12. The device according to claim 1, further comprising a first gate pad and a second gate pad, respectively arranged on a first side of the device adjacent to the first channel layer and a second side of the device adjacent to the second channel layer, the first gate pad in contact with the first gate electrode and the second gate pad in contact with the second gate electrode.

13. The device according to claim 1, wherein the first stack of semiconductor layers and the second stack of semiconductor layers mirror one another.

14. The device according to claim 1, wherein the first HEMT transistor and the second HEMT transistor have a same threshold voltage.

15. The device according to claim 1, wherein the first and second channel layers each comprises GaN and the first and second barrier layers each comprises an AlGaN ternary alloy.

16. The device according to claim 1, wherein in operation, the first drain electrode and the second source electrode are at a same electric potential, and the first source electrode and the second drain electrode is at a same electric potential.

17. A device, comprising:
- a first high electron mobility (HEMT) transistor including a first source electrode, a first drain electrode, and a first gate electrode laterally between the first source electrode and the first drain electrode; and
- a second HEMT transistor stacked on the first HEMT transistor along a vertical direction, the second HEMT transistor including a second source electrode, a second drain electrode, and a second gate electrode laterally between the second source electrode and the second drain electrode, the second source electrode coupled to the first drain electrode, and the second drain electrode coupled to the first source electrode,
- wherein the first HEMT transistor and the second HEMT transistor have a same threshold voltage.

18. The device of claim 17, further comprising:
- a first diode coupled between the second source electrode and the first drain electrode; and
- a second diode coupled between the second drain electrode and the first source electrode.

19. A device, comprising:
- a first high electron mobility (HEMT) transistor, the first HEMT transistor including a first stack of semiconductor layers on a first surface of an insulating layer, the first stack of semiconductor layers including, from the first surface of the insulating layer, a first barrier layer and a first channel layer, the first HEMT transistor including a first source electrode, a first drain electrode, and a first gate electrode;
- a second HEMT transistor, the second HEMT transistor including a second stack of semiconductor layers on a second surface of the insulating layer that is opposite to the first surface, the second stack of semiconductor layers including, from the second surface of the insulating layer, a second barrier layer and a second channel layer, the second HEMT transistor including a second source electrode, a second drain electrode, and a second gate electrode;
- a first diode in the insulating layer and coupled between the second source electrode and the first drain electrode;
- a second diode in the insulating layer and coupled between the second drain electrode and the first source electrode; and
- a first gate pad and a second gate pad, respectively arranged on a first side of the device adjacent to the first channel layer and a second side of the device adjacent to the second channel layer, the first gate pad in contact with the first gate electrode and the second gate pad in contact with the second gate electrode.

20. The device of claim 19, wherein a cathode terminal of the first diode and the second drain electrode are a same conductive structure, and an anode terminal of the first diode is coupled to the first source electrode via an interconnection structure.

* * * * *